(12) United States Patent
Chang et al.

(10) Patent No.: US 7,469,461 B2
(45) Date of Patent: Dec. 30, 2008

(54) METHOD FOR MAKING A DIAPHRAGM UNIT OF A CONDENSER MICROPHONE

(75) Inventors: Chao-Chih Chang, Taichung (TW); Ray-Hua Horng, Taichung (TW); Jean-Yih Tsai, Taichung Hsien (TW); Chung-Chin Lai, Taichung (TW); Ji-Liang Chen, Chang-Hua Hsien (TW)

(73) Assignee: Taiwan Carol Electronics Co., Ltd., Taichung (TW)

( * ) Notice: Subject to any disclaimer, the term of this patent is extended or adjusted under 35 U.S.C. 154(b) by 497 days.

(21) Appl. No.: 11/298,128

(22) Filed: Dec. 9, 2005

(65) Prior Publication Data

US 2007/0134839 A1    Jun. 14, 2007

(51) Int. Cl.
*H04R 31/00* (2006.01)

(52) U.S. Cl. ........................ 29/594; 29/25.42; 29/609.1; 29/876; 29/877; 216/62; 216/66; 216/67; 156/308.2; 156/309.6; 156/309.9; 156/320; 367/178; 367/180; 381/174; 381/191; 438/3; 438/42; 438/57; 438/98

(58) Field of Classification Search ................ 29/25.42, 29/594, 602.1, 609.1, 876, 877; 216/62, 216/66, 67; 156/308.2, 309.6, 309.9, 320; 367/178, 180; 381/174, 191; 427/96, 97, 427/116, 123, 124; 438/3, 42, 57, 98
See application file for complete search history.

(56) References Cited

U.S. PATENT DOCUMENTS 5,490,220 A * 2/1996 Loeppert .................... 381/355
5,759,870 A * 6/1998 Yun et al. ..................... 438/53

* cited by examiner

*Primary Examiner*—Paul D Kim
(74) *Attorney, Agent, or Firm*—Trop, Pruner & Hu, P.C.

(57) ABSTRACT

A method for making a diaphragm unit of a condenser microphone includes the steps of: forming a liftoff layer on a substrate; forming an insulator diaphragm film on the liftoff layer; and removing the liftoff layer from the diaphragm film and the substrate so as to separate the diaphragm film from the substrate.

11 Claims, 9 Drawing Sheets

METHOD FOR MAKING A DIAPHRAGM UNIT OF A CONDENSER MICROPHONE

BACKGROUND OF THE INVENTION

1. Field of the Invention

This invention relates to a method for making a condenser microphone, more particular to a method for making a diaphragm unit of a condenser microphone using liftoff techniques.

2. Description of the Related Art

Various methods and materials have been used for fabricating condenser microphones. A silicon wafer is normally used and is patterned by etching and deposition so as to form layered structures, such as a diaphragm and a back plate of the condenser microphone, thereon when using semiconductor techniques to fabricate a condenser microphone. U.S. Pat. No. 5,573,679 mentions a single-wafer process and a two-wafer process for fabricating a condenser microphone. In the two-wafer process, the diaphragm and the back plate are formed on separate silicon wafers, which are then bonded together. After bonding, the pair of the wafers is diced into individual capacitor devices for making condenser microphones. In the single-wafer process, after formation of the layered structures, the silicon wafer is also required to be diced into individual capacitor devices.

The aforesaid conventional methods are disadvantageous in that the individual capacitor devices thus formed are likely to be damaged due to the dicing operation, which results in a decrease in the production yield.

SUMMARY OF THE INVENTION

Therefore, the object of the present invention is to provide a method for making a diaphragm unit of a condenser microphone that is capable of overcoming the aforesaid drawback of the prior art.

According to the present invention, there is provided a method for making a diaphragm unit of a condenser microphone. The method comprises: forming a liftoff layer on a substrate; forming an insulator diaphragm film on the liftoff layer; and removing the liftoff layer from the diaphragm film and the substrate so as to separate the diaphragm film from the substrate.

BRIEF DESCRIPTION OF THE DRAWINGS

In drawings which illustrate an embodiment of the invention.

DETAILED DESCRIPTION OF THE PREFERRED EMBODIMENT

Figure 1:
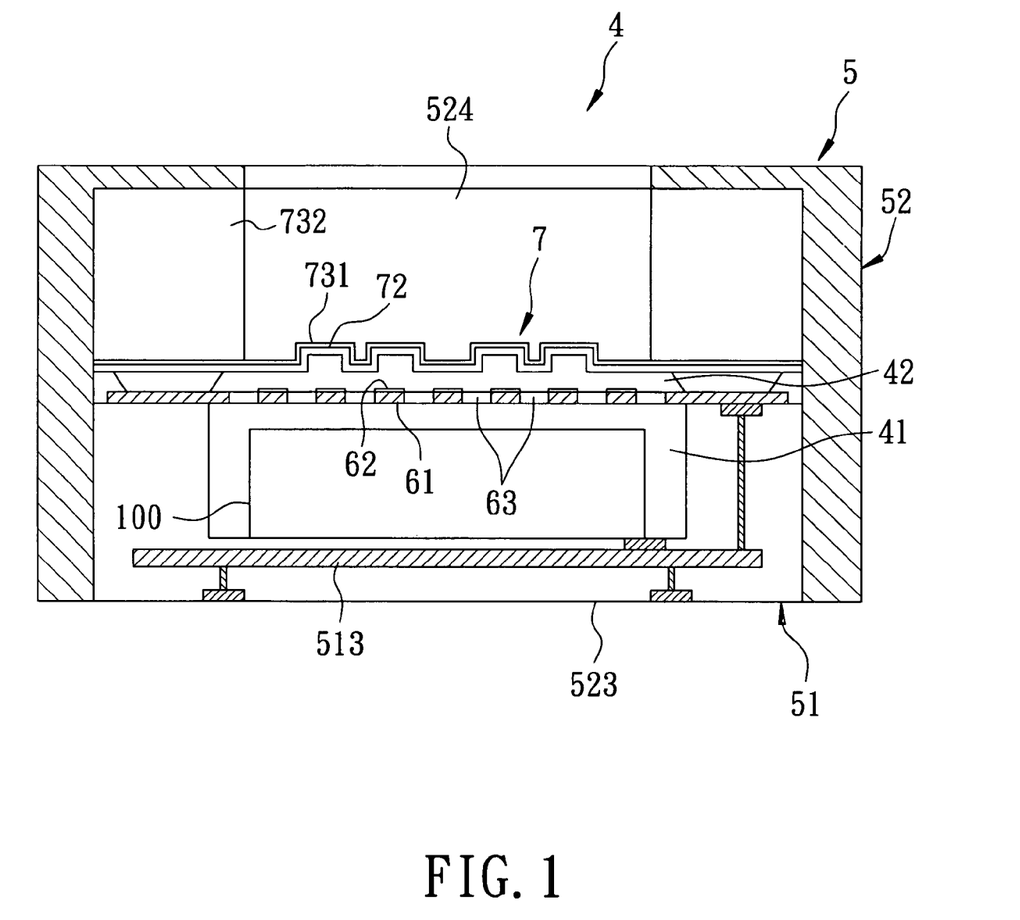
FIG. 1 is a schematic sectional view of a condenser microphone made according to the preferred embodiment of a method of this invention.
Figure 2:
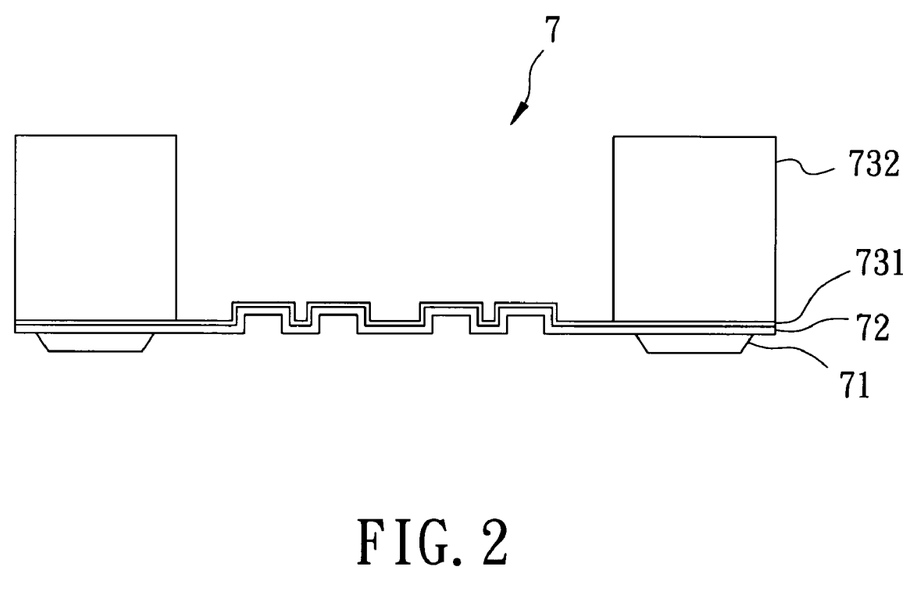
FIG. 2 is a schematic view of a diaphragm unit of the condenser microphone formed according to the method of the preferred embodiment.

FIGS. 1 and 2 illustrate a condenser microphone 4 made according to the preferred embodiment of a method of this invention. The condenser microphone 4 includes a condenser housing 5, a field effect transistor (FET) 100, a conductive back plate 61, and a diaphragm unit 7.

The condenser housing 5 includes a surrounding wall body 52 formed with an access opening 523 that is covered by a cap wall 51 which extends into the surrounding wall body 52 and which is formed with a recess 41 within the condenser housing 5. The surrounding wall body 52 is further formed with a sound inlet 524 opposite to the recess 41 for passage of sound there through.

A circuit 531 is formed on the cap wall 51. The FET 100 is mounted in the recess 41, and is electrically coupled to the circuit 513 and the diaphragm unit 7 for impedance conversion.

The back plate 61 is disposed in the condenser housing 5, is supported on the cap wall 51, and is formed with a plurality of through-holes 63 and an electret 62 thereon.

The diaphragm unit 7 is disposed in the condenser housing 5, and includes a diaphragm film 72 that is formed on an annular spacer layer 71 which is supported on the back plate 61, an electrode layer 731 that is formed on the diaphragm film 72, and an annular conductive connecting pad 732 that is formed on the electrode layer 731. The diaphragm film 72 is spaced apart from the back plate 61 by the spacer layer 71 so as to form a variable gap 42 therebetween, and cooperates with the back plate 61 to form a capacitor. The electrode layer 731 and the back plate 61 respectively define first and second electrodes of the capacitor.

Figure 3:
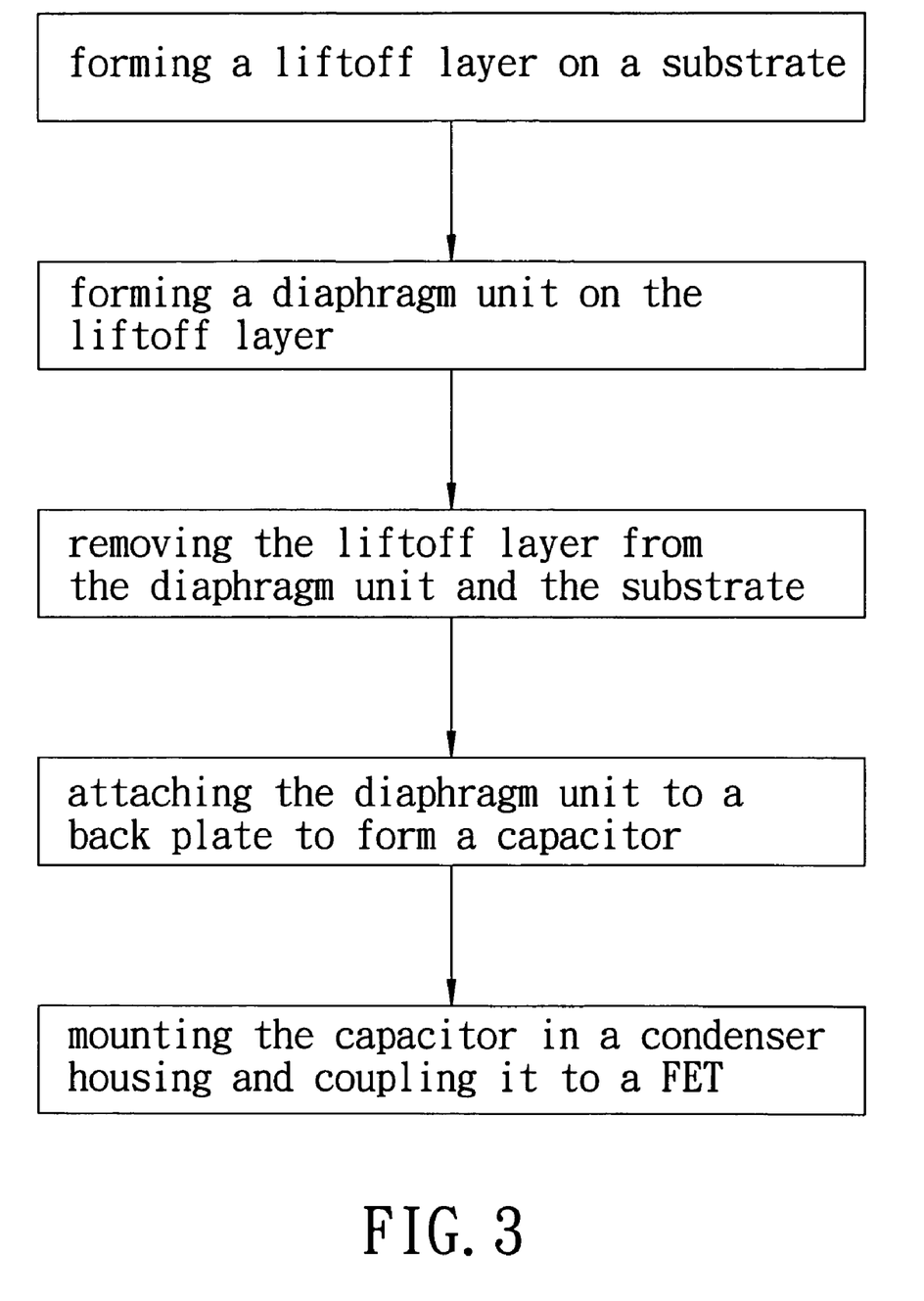
FIG. 3 is a flow chart illustrating consecutive steps of the method of the preferred embodiment.
Figure 4:
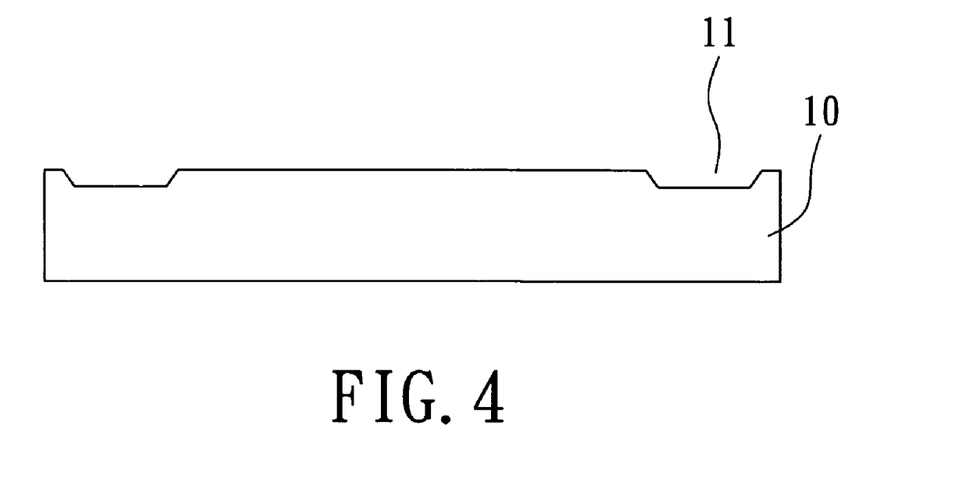
FIGS. 4 to 13 are schematic views to illustrate the consecutive steps of the method of the preferred embodiment.
Figure 5:
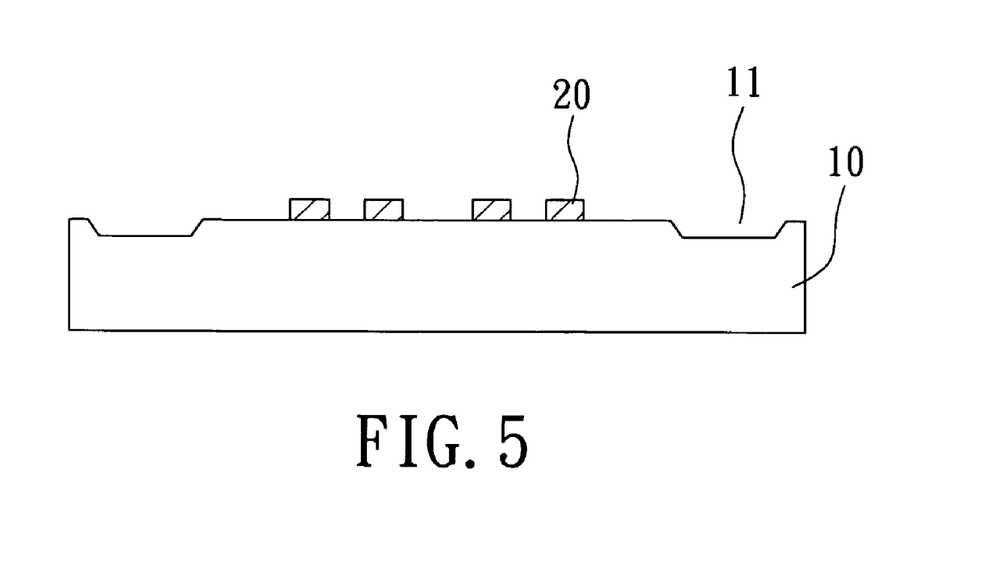
Figure 6:
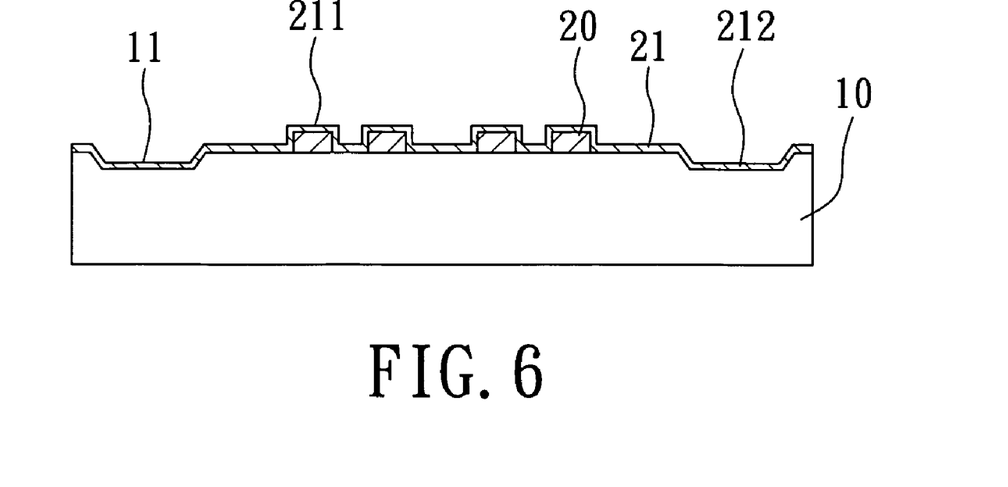
Figure 7:
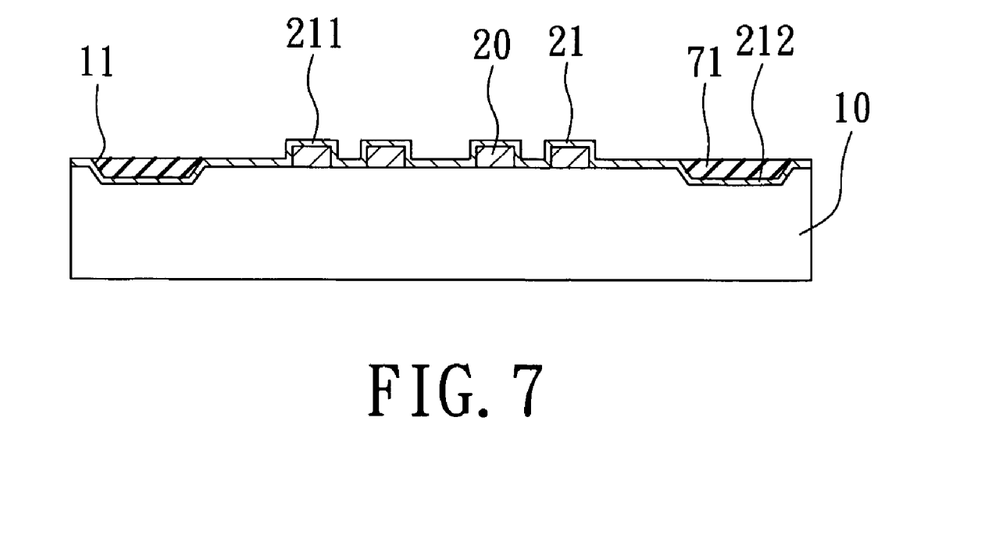
Figure 8:
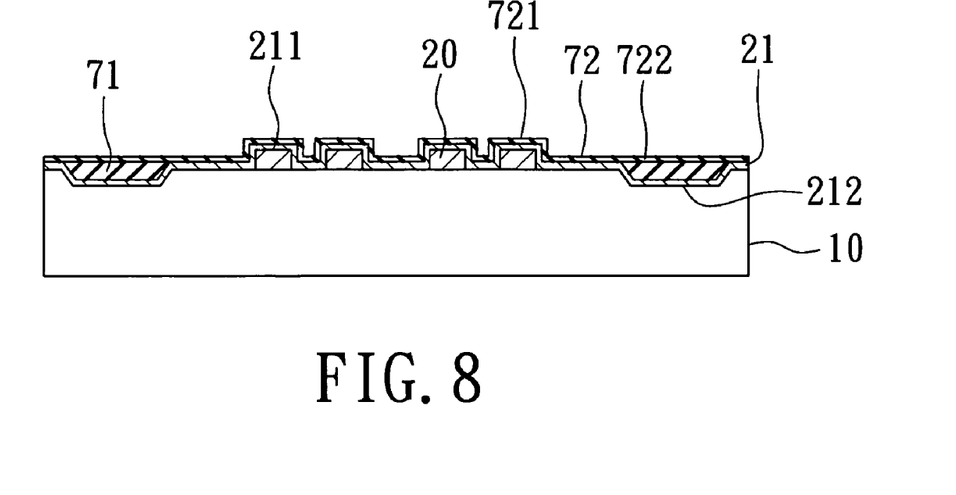
Figure 9:
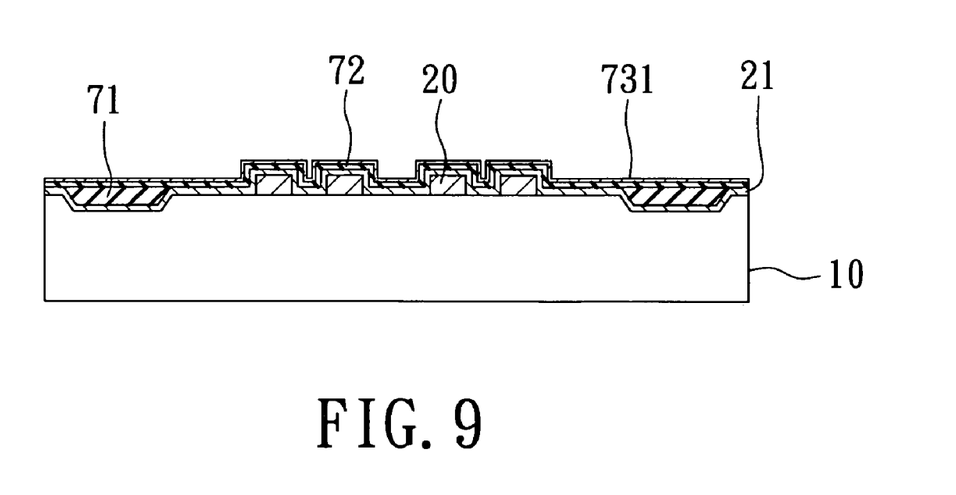

FIG. 3 illustrates consecutive steps of the preferred embodiment of a method for making the condenser microphone 4 according to this invention.

The method includes the steps of: forming the diaphragm unit 7; attaching the spacer layer 71 of the diaphragm unit 7 to the back plate 61 so as to form the variable gap; mounting the capacitor in the condenser housing 5 through the access opening 523; mounting the field effect transistor 100 in the recess 41 in the cap wall 51 and electrically coupling the field effect transistor 100 to the circuit 513 and the capacitor; and covering the access opening 523 by extending the cap wall 51 into the condenser housing 5.

Referring now to FIGS. 4 to 13, in combination with FIGS. 1 and 2, the main steps involved in the formation of the diaphragm unit 7 include: forming a liftoff layer 21 on a substrate 10 (see FIG. 6); forming the insulator diaphragm film 72 on the liftoff layer 21 (see FIG. 8); and removing the liftoff layer 21 from the diaphragm film 72 and the substrate 10 (see FIG. 13) so as to separate the diaphragm film 72 from the substrate 10. It is noted that for the sake of simplicity, FIGS. 4 to 13 only show the formation of a single diaphragm unit 7. However, during mass production, a large number of the diaphragm units 7 are simultaneously formed on one wafer, such as a silicon wafer. The diaphragm units 7 formed on the wafer are separated from each other immediately after the liftoff layer 21 is removed, thereby dispensing with the dicing operation as required in the aforesaid conventional methods.

In this embodiment, a spacer-forming groove 11 is formed in the substrate 10 (see FIG. 4), and a pattern of liftoff protrusions 20 is formed on the substrate 10 (see FIG. 5) through semiconductor techniques prior to the formation of the liftoff layer 21 such that the spacer-forming groove 11 is disposed around the liftoff protrusions 20. The liftoff layer 21 is formed on and contours along an exposed surface of the substrate 10 and exposed surfaces of the liftoff protrusions 20 (see FIG. 6) such that the liftoff layer 21 is formed into a folding region 211 that covers the liftoff protrusions 20, and a spacer region 212 that extends from the folding region 211 and that is disposed in the spacer-forming groove 11.

The spacer layer 71 is formed on the spacer region 212 of the liftoff layer 21 (see FIG. 7) prior to the formation of the diaphragm film 72 such that the spacer layer 71 fills the spacer-forming groove 11. The diaphragm film 72 is formed on and contours along the folding region 211 of the liftoff layer 21 and an exposed surface of the spacer layer 71 (see FIG. 8) such that the diaphragm film 72 is formed into a folding area 721 that overlaps the folding region 211 of the liftoff layer 21, and an electrode-forming area 722 that overlaps the spacer region 212 of the liftoff layer 21.

Figure 10:
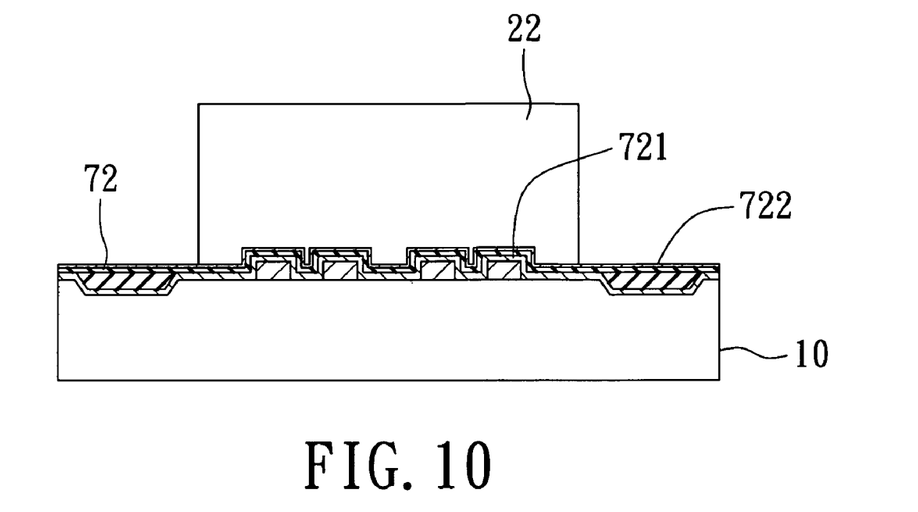
Figure 11:
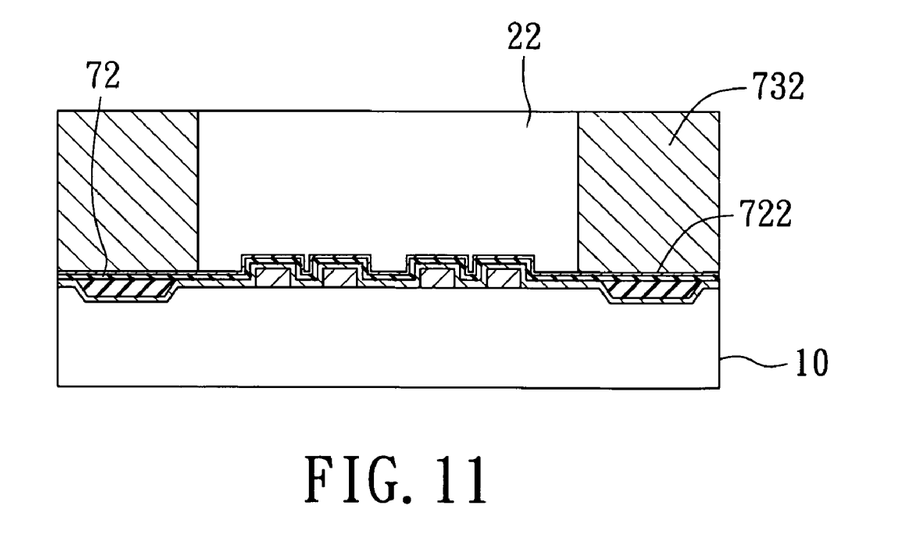
Figure 12:
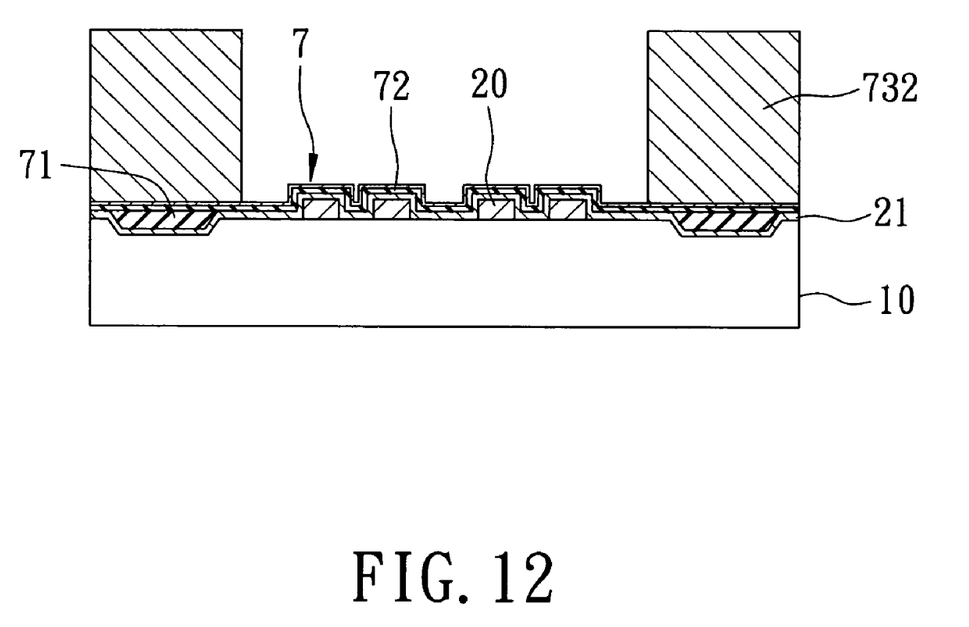

A sacrificial layer 22 of a photoresist material is then formed on the folding area 721 of the diaphragm film 72 (see FIG. 10). It is noted that the electrode layer 731 is formed on the diaphragm film 72 (see FIG. 9) in this embodiment prior to the formation of the sacrificial layer 22.

The conductive connecting pad 732 is then formed on the electrode layer 731 on the electrode-forming area 722 of the diaphragm film 72 (see FIG. 11) using plating techniques such that the sacrificial layer 22 is surrounded by the conductive connecting pad 732. When the electrode layer 731 is made from a composite of chrome and gold, the conductive connecting pad 732 is preferably made from nickel.

Figure 13:
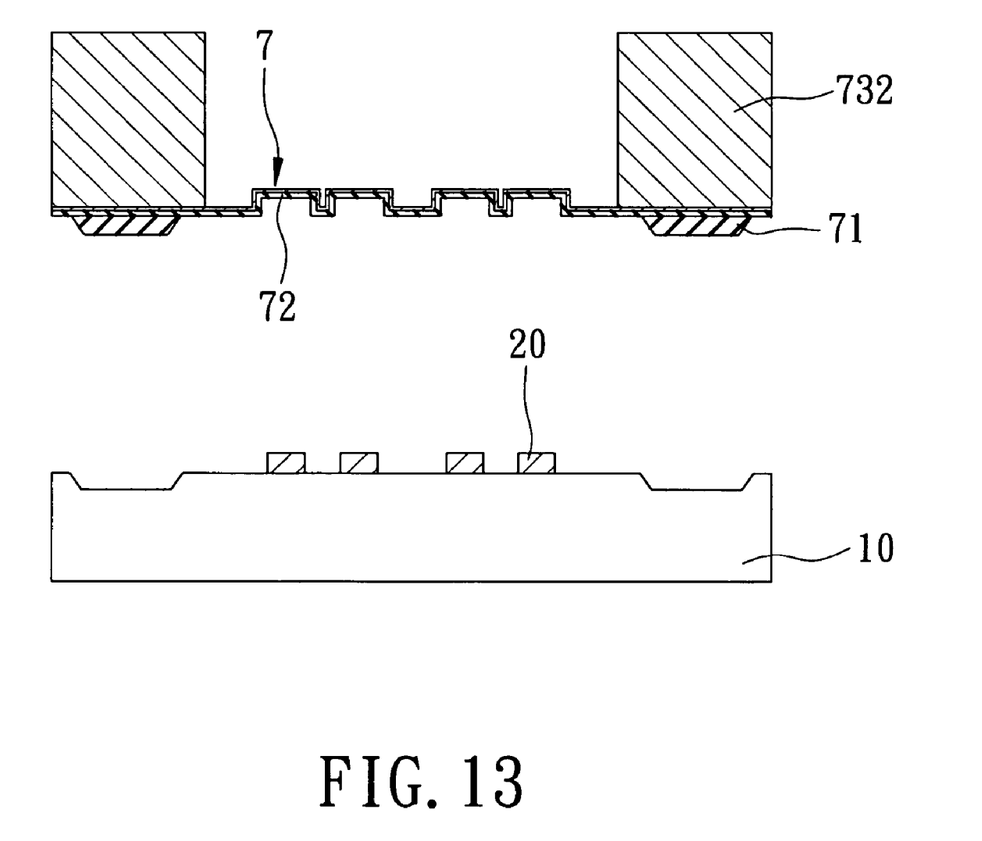

After formation of the conductive connecting pad 732, the sacrificial layer 22 is removed from the diaphragm film 72 (see FIG. 12) using a photoresist stripper prior to the removal of the liftoff layer 21 (see FIG. 13).

Preferably, the liftoff layer 21 is made from aluminum, and is removed through wet etching techniques using a hydrochloric acid solution. In this embodiment, the liftoff protrusions 20 are formed on the substrate 10 using semiconductor techniques, and are made from a photoresist material so that the liftoff protrusions 20 will not be etched away from the substrate 10 during wet etching of the liftoff layer 21. Hence, after removal of the liftoff layer 21, the liftoff protrusions 20 remain on the substrate 10 so that the substrate 10 together with the liftoff protrusions 20 (see FIG. 13) can be recycled. Note that the liftoff protrusions 20 can also be removed from the substrate 10 when only the substrate 10 is required to be recycled. In this case, the liftoff protrusions 20 are preferably made from aluminum. As such, the liftoff layer 21 and the liftoff protrusions 20 are simultaneously removed from the substrate 10 during the wet etching operation. In addition, the preferred embodiment can be modified in such a manner that the liftoff layer 21 can be formed on the substrate 10 prior to the formation of the liftoff protrusions 20 and that the liftoff protrusions 20 are subsequently formed on the liftoff layer 21. As such, the liftoff layer 21 and the liftoff protrusions 20 are preferably made from aluminum so that both the liftoff layer 21 and the liftoff protrusions 20 can be simultaneously removed from the substrate 10 using the wet etching techniques.

Alternatively, the liftoff layer 21 can be made from silicon dioxide, which can be etched using BOE etchant.

In this embodiment, the diaphragm film 72 is formed into the folding area 721. However, the folding area 721 of the diaphragm film 72 can be replaced by a different configuration, such as a flat shape, based on the actual design requirement.

With the inclusion of forming the liftoff layer 21 in the method of this invention, the aforesaid drawback associated with the prior art can be eliminated.

With the invention thus explained, it is apparent that various modifications and variations can be made without departing from the spirit of the present invention. It is therefore intended that the invention be limited only as recited in the appended claims.

What is claimed is:

1. A method for making a diaphragm unit of a condenser microphone, comprising:
   forming a spacer-forming groove in a substrate;
   forming a pattern of liftoff protrusions on the substrate such that the spacer-forming groove is disposed around the liftoff protrusions;
   forming a liftoff layer on the substrate, the liftoff layer being formed on and contouring along an exposed surface of the substrate and exposed surfaces of the liftoff protrusions such that the liftoff layer is formed into a folding region that covers the liftoff protrusions, and a spacer region that extends from the folding region and that is disposed in the spacer-forming groove;
   forming an insulator spacer layer on the spacer region of the liftoff layer such that the spacer layer fills the spacer-forming groove;
   forming an insulator diaphragm film on the liftoff layer, the diaphragm film being formed on and contouring along the folding region of the liftoff layer and an exposed surface of the spacer layer such that the diaphragm film is formed into a folding area that overlaps the folding region of the liftoff layer, and an electrode-forming area that overlaps the spacer region of the liftoff layer;
   forming a sacrificial layer on the folding area of the diaphragm film; and
   removing the liftoff layer from the diaphragm film and the substrate so as to separate the diaphragm film from the substrate.

2. The method of claim 1, further comprising forming an electrode layer on the electrode-forming area of the diaphragm film.

3. The method of claim 2, further comprising removing the sacrificial layer from the diaphragm film after formation of the electrode layer and prior to the removal of the liftoff layer.

4. The method of claim 1, wherein the liftoff layer is made from aluminum, and is removed through wet etching techniques.

5. The method of claim 4, wherein the liftoff protrusions are made from aluminum, and the liftoff layer and the liftoff protrusions are simultaneously removed from the substrate during the wet etching operation.

6. A method for making a condenser microphone, comprising:
   forming a diaphragm unit by:
      forming a liftoff layer on a substrate, the liftoff layer having a folding region and a spacer region disposed around the folding region,
      forming an insulator spacer layer on the spacer region of the liftoff layer,
      forming an insulator diaphragm film on the folding region of the liftoff layer and the spacer layer, the diaphragm film having an electrode-forming area that overlaps the spacer region of the liftoff layer,
      forming an electrode layer on the electrode-forming area of the diaphragm film, and
      removing the liftoff layer from the diaphragm film and the substrate so as to separate the diaphragm unit from the substrate;
   attaching the spacer layer of the diaphragm unit to a conductive back plate such that the diaphragm film is spaced apart from the back plate by the spacer layer, thereby forming a variable gap therebetween, the back plate defining an electrode and cooperating with the diaphragm unit to form a capacitor; and
   mounting the capacitor in a condenser housing.

7. The method of claim 6, wherein the back plate is formed with a plurality of through-holes, the condenser housing defining a recess therein such that the recess is in fluid communication with the variable gap through the through-holes in the back plate, the method further comprising mounting a field effect transistor in the recess in the condenser housing, and electrically coupling the field effect transistor to the capacitor for impedance conversion.

8. The method of claim 6, wherein the step of forming the diaphragm unit further includes forming a pattern of liftoff protrusions on the substrate prior to the formation of the liftoff layer, the liftoff layer being formed on and contouring along an exposed surface of the substrate and exposed surfaces of the liftoff protrusions so as to form the liftoff layer into the folding region that covers the liftoff protrusions, and the spacer region that extends from the folding region, the diaphragm film being formed on and contouring along the folding region of the liftoff layer and an exposed surface of the spacer layer such that the diaphragm film is formed into a folding area that overlaps the folding region of the liftoff layer, and an electrode-forming area that overlaps the spacer region of the liftoff layer, the electrode layer being formed on the electrode-forming area of the diaphragm film.

9. The method of claim 8, wherein the step of forming the diaphragm unit further includes forming a sacrificial layer on the folding area of the diaphragm film prior to the formation of the electrode layer on the diaphragm film.

10. The method of claim 9, wherein the step of forming the diaphragm unit further includes removing the sacrificial layer from the diaphragm film after formation of the electrode layer and prior to the removal of the liftoff layer.

11. The method of claim 10, wherein the liftoff layer is made from aluminum, and is removed through wet etching techniques.

* * * * *